United States Patent [19]
Vacheron et al.

[11] Patent Number: 6,025,996
[45] Date of Patent: Feb. 15, 2000

[54] UNITARY CONTACT BLOCK AND PRINTED CIRCUIT BOARD

[75] Inventors: Robert Vacheron, Smyrna; Venus Desai, Lawrenceville, both of Ga.; John C. Byrne, Chicago; Jim Barber, Mundelein, both of Ill.

[73] Assignee: Motorola, Inc., Schaumburg, Ill.

[21] Appl. No.: 09/032,600

[22] Filed: Feb. 27, 1998

[51] Int. Cl.⁷ .............................. H01R 9/09; H01R 13/66
[52] U.S. Cl. ..................... 361/774; 361/782; 361/823; 439/83; 439/620
[58] Field of Search ................... 361/773, 774, 361/811, 822, 823, 760, 772, 782; 439/513, 620, 862, 78, 83, 507, 509; 29/832, 842; 257/692, 693, 696, 924; 429/96, 98, 99, 100

[56] References Cited

U.S. PATENT DOCUMENTS

| | | | |
|---|---|---|---|
| 5,224,021 | 6/1993 | Takada et al. | 361/774 |
| 5,322,974 | 6/1994 | Walston | 174/261 |
| 5,650,920 | 7/1997 | Pfizenmayer | 361/811 |
| 5,865,648 | 2/1999 | Clyatt, III | 439/620 |

*Primary Examiner*—Donald Sparks
*Assistant Examiner*—John B Vigushin
*Attorney, Agent, or Firm*—Felipe J. Farley

[57] ABSTRACT

Described is an integral electrical contact block and printed circuit board for an electrical device. The electrical contacts arch over components on the printed circuit board and are secured to the printed circuit board at either end of the arch. A second arch is above the lower arch, secured to the lower arch at one end, forming a structure with an open mouth. This open mouth can capture a plastic housing. The contact provides protection for components beneath it, provides for efficient use of space in an electrical device, and the mouth of the contact absorbs shock that otherwise might be transmitted directly to solder joints on the printed circuit board.

4 Claims, 2 Drawing Sheets

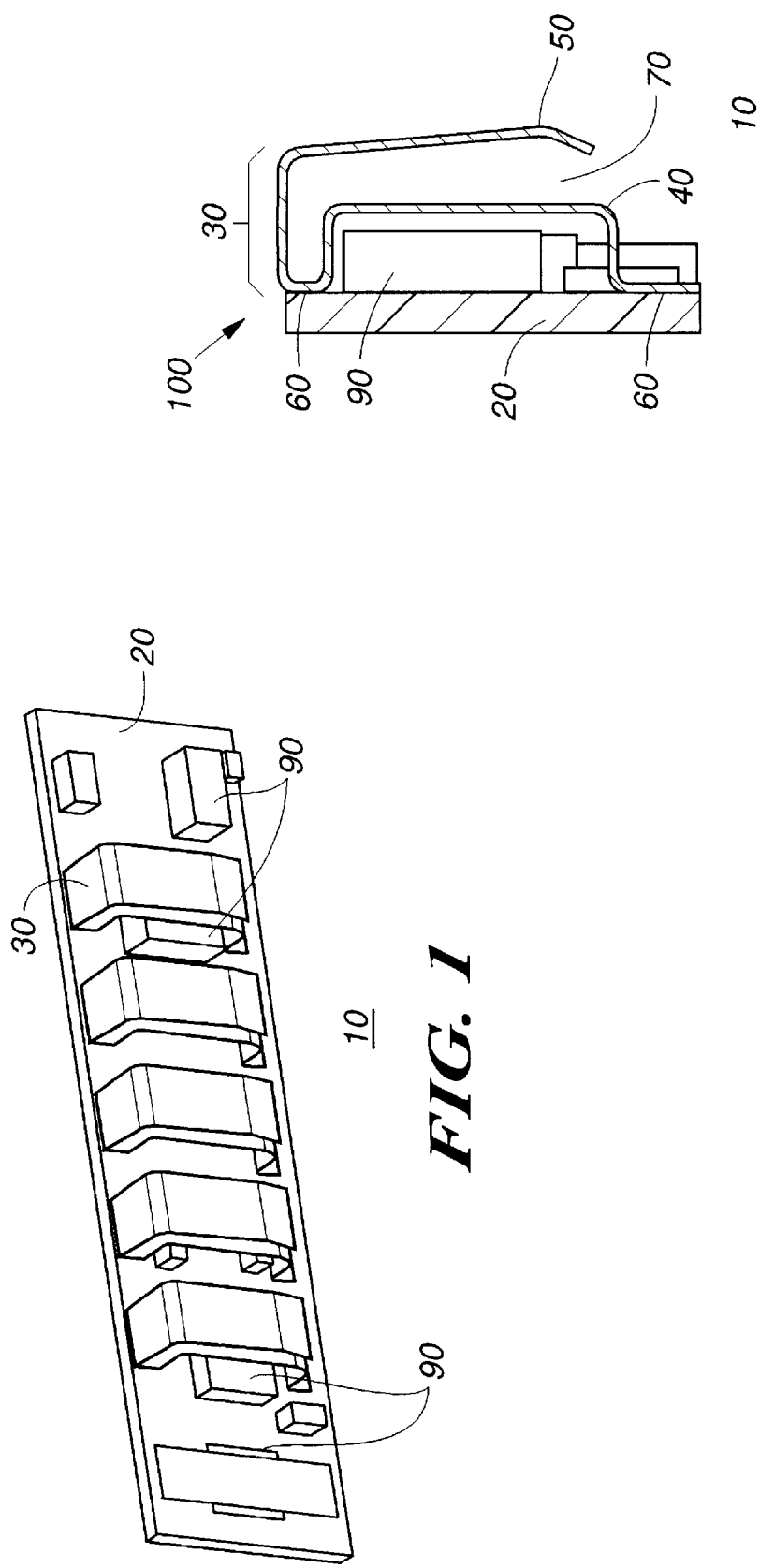

UNITARY CONTACT BLOCK AND PRINTED CIRCUIT BOARD

TECHNICAL FIELD

This invention relates in general to the field of electronic devices, and more particularly in the field of electrical contacts for electronic devices.

BACKGROUND OF THE INVENTION

Nearly forty million Americans use a cellular telephone and another seven million or so are expected to subscribe this year. Sales of cellular telephones have been faster than those of fax machines, subscriptions to cable television, and video cassette recorders. Cellular telephones have become a fixture of the American business and recreational landscape. Increasing use of cellular telephones has raised customers' expectations for durability and reliability. A critical aspect of the reliability of a cellular telephone is the reliability of its power source, the battery. Batteries should be resistant to moderate changes in temperature, and resistant to moderate mechanical stresses, such as those caused by dropping from a low height. The thrust of research in the area of mechanical reliability of batteries is to providing better solutions at a reasonable materials cost. Therefore, there is a need for a battery with improved mechanical reliability.

BRIEF DESCRIPTION OF THE DRAWINGS

FIG. 1 is a perspective drawing of the integral contact block and printed circuit board of the present invention.

FIG. 2 is a side view of the integral contact block and printed circuit board of the present invention;

DETAILED DESCRIPTION OF THE PREFERRED EMBODIMENT

Figure 3:
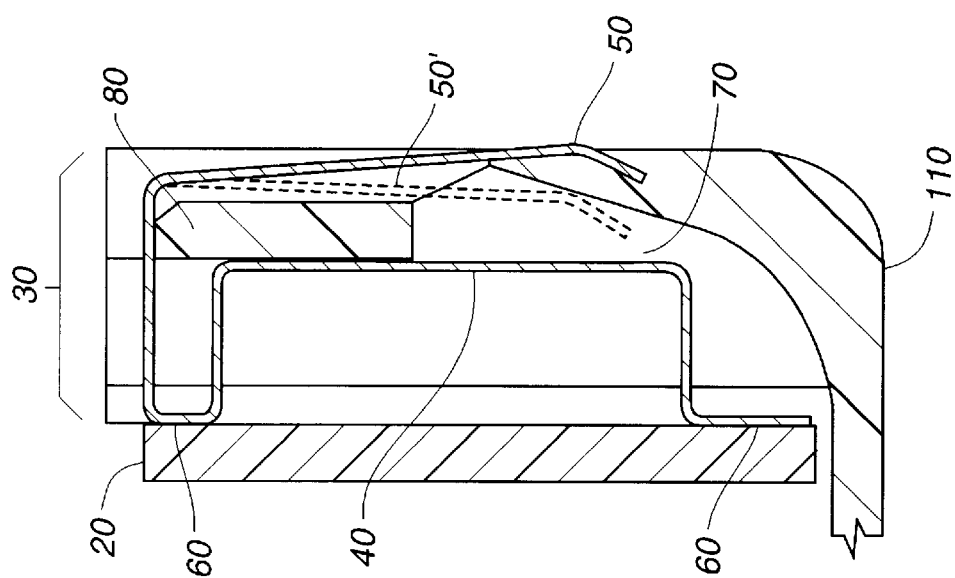
FIG. 3 is a side cutaway view of the integral contact block and printed circuit board of the present invention, showing the contact capturing the plastic housing in its mouth.

The present invention is an integral electrical contact block and circuit board. The electrical contacts are located above the surface mounted components on the circuit board. Each electrical contact is actually composed of two arches, one above the other. The first arch arches over one or more components on the circuit board and is secured to the circuit board at both ends of the arch. The second arch arches over the first arch, and one end of the second arch is secured to one end of the first arch. The other end of the second arch thus forms an open mouth with the first arch. The lower arch thus provides physical protection for the components mounted beneath it. The open mouth, with its attendant springiness can be used to secure the whole contact block-circuit board assembly through an object such as plastic housing. In one embodiment of the invention, the circuit board is a printed circuit board.

Current battery technology uses one of two approaches to electrically connect the battery to the host device. In one approach a contact block is formed directly in a plastic housing, and then sometimes welded to the battery. In the other approach, stamped contacts are reflow soldered onto a flexible connector. An insert molded contact block is usually chosen in an electrical application where space is not the highest consideration. Insertmolded contacts are bigger than stamped contacts on a flexible connector, but are more durable and easier to assemble.

If space within the battery pack is at a premium, flexible connectors are employed. The contact is reflowed onto a flexible circuit, and then assembled into the electrical device housing. Use of flexible circuitry allows a more efficient use of space within a housing such as a battery housing, but the multi-layer flexible circuit is expensive, and solder joints to such circuitry have a higher probability of failing. In addition, an assembly process for a battery which includes flexible circuit is difficult to automate.

The present invention occupies less space than an insert molded contact block since the printed circuit (PC) board and the contacts share nearly the same physical space. It is also far more durable than is flexible connector, and is much easier to assemble. Furthermore, since the contacts of the present invention are connected at two different points to the circuit board, they are more resistant to mechanical stress. This improved structural integrity manifests itself in improved resistance to tension, compression, and torsion. The contacts are a lot easier to align during assembly because dual pad soldering to the circuit board is more stable than single pad soldering. Since the printed circuit board components are located beneath the arch of the contacts, this improves the resistance to jarring since the components themselves are protected from impact. Furthermore, in the present invention, the contacts can actively capture an object such as plastic battery housing. Thus when such a battery is dropped, the contacts absorb the brunt of impact rather than the solder joints absorbing.

FIG. 1 shows a perspective view of the integral contact block and printed circuit board (10) of the present invention. Circuit board (20) has surface mounted components (90), and arching above surface mounted components (90) are the contacts (30). FIG. 2 shows a side view of the present invention (10). Each of the surface mounted contacts (30) consists of a lower arch (40) and an upper arch (50). The lower arch (40) arches over one or more components (90) on the printed circuit board (20). Lower arch (40) is secured to printed circuit board (20) at the mounting point (60) on either end of the arch. These mounting points (60) are typically solder joints. The upper arch (50) of the contact arches over the lower arch (40), and is joined to the lower arch at point 100. This forms a structure with an open mouth (70). Since the contact is made of a flexible conductive material, an object larger than the mouth (70) of the contact may be placed within the mouth. This object will then be retained in the mouth (70) by the natural springiness of the contact. Also shown in FIG. 2, the upper arch (50) and lower arch (40) may be formed of one continuous strip of conductive flexible material. The contact may be formed of any suitable flexible conductive material, such as metals or conductive polymers.

FIG. 3 shows the integral contact block and circuit board of the present invention (10) mounted in a plastic housing (110). This is a side cutaway view. For simplicity, no components are shown in this view. Here captured plastic (80) is in the mouth (70) of the contact, and the upper arch (50) of the contact has been moved from 50' to 50. The natural springiness causes the contact to grasp securely the captured plastic (80).

In one embodiment of the invention, one or more of the contacts is a continuous strip of conductive material which is or may be directly connected, mechanically, and electrically, to a battery cell.

The integral contact block and printed circuit board of the present invention can be used in any electrical device where space is a scarce commodity and circuit components need protection from jarring.

The present invention will be further understood with reference to the following example.

EXAMPLE I

An integral contact block and printed circuit board were constructed according to the present invention, for use with a lithium-ion cell for a battery pack for a cellular telephone. The printed circuit board measured approximately 34 millimeters long by 9 millimeters wide by 1 millimeter thick. There were five surface-mounted contacts on the PC board, each one made out of a flat rectangular strip of nickel-plated steel about 21 millimeters long by 2 millimeters wide by 0.2 millimeter thick. The single strip formed both arches. The lower arch was about 5 millimeters wide at the base, and formed a square arch about 2 millimeters high. Various circuit components were disposed beneath this lower arch. The upper portion of the arch had a mouth about 2 millimeters wide at its widest point. The contact was shaped so that the mouth of the contact slipped over the plastic battery housing, exposing the upper arch of the contacts to the outside. A cellular telephone could then make contact with these electrical contacts.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. An integral contact block and circuit board comprising electrical contacts and at least one component, where each of the electrical contacts arch over the at least one component of the circuit board, where each of the electrical contacts is composed of a lower arch and an upper arch, wherein the lower arch is secured to the circuit board at both ends of the lower arch and the upper arch is secured to the lower arch at one end of the lower arch.

2. The integral contact block and circuit board of claim 1, wherein the electrical contacts are formed of a flexible, conductive material selected from the group consisting of metals and conductive polymers.

3. The integral contact block and circuit board of claim 1, wherein the circuit board is a printed circuit board.

4. The integral contact block and circuit board of claim 1, where one or more of the electrical contacts further comprises a continuous strip of conductive material which is directly connected, mechanically and electrically, to a battery cell.

* * * * *